United States Patent
Hsu et al.

(10) Patent No.: US 6,551,895 B1
(45) Date of Patent: Apr. 22, 2003

(54) METAL OXIDE SEMICONDUCTOR CAPACITOR UTILIZING DUMMY LITHOGRAPHIC PATTERNS

(75) Inventors: Louis L. Hsu, Fishkill, NY (US); Dmitry Netis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/666,324

(22) Filed: Sep. 21, 2000

Related U.S. Application Data

(62) Division of application No. 09/224,767, filed on Jan. 4, 1999, now Pat. No. 6,157,067.

(51) Int. Cl.⁷ ............................................. H01L 21/20
(52) U.S. Cl. ..................... 438/396; 438/243; 438/246; 438/386
(58) Field of Search ................................ 438/197, 199, 438/210, 243, 246, 287, 386, 389, 381, 388, 396, 800; 257/369, 368, 371

(56) References Cited

U.S. PATENT DOCUMENTS

| | | | | |
|---|---|---|---|---|
| 4,339,766 A | * | 7/1982 | Rao | 357/41 |
| 4,641,279 A | | 2/1987 | Kimura et al. | 365/149 |
| 5,322,438 A | | 6/1994 | McNutt et al. | 716/8 |
| 5,361,234 A | * | 11/1994 | Iwasa | 257/296 |
| 5,371,032 A | | 12/1994 | Nishihara | 438/152 |
| 5,414,285 A | | 5/1995 | Nishihara | 257/301 |
| 5,496,757 A | | 3/1996 | Rosner | 438/253 |
| 5,635,421 A | | 6/1997 | Ting | 438/396 |
| 5,937,322 A | * | 8/1999 | Matsuura | 438/253 |
| 5,998,846 A | * | 12/1999 | Jan et al. | 257/296 |
| 6,101,939 A | * | 1/2000 | Bothra | 438/386 |
| 6,020,616 A | * | 2/2000 | Bothra et al. | 257/381 |
| 6,232,154 B1 | * | 5/2001 | Reith et al. | 257/401 |
| 6,353,248 B1 | * | 3/2002 | Reith et al. | 257/368 |

FOREIGN PATENT DOCUMENTS

| | | | |
|---|---|---|---|
| JP | 5-326875 A | * | 12/1993 |

* cited by examiner

*Primary Examiner*—Olik Chaudhuri
*Assistant Examiner*—Fernando Toledo
(74) *Attorney, Agent, or Firm*—Todd M. C. Li; McGinn & Gibb, P.C.

(57) ABSTRACT

A semiconductor structure (and method for manufacturing the same) comprises an active array of first elements having a first manufacturing precision, a peripheral region surrounding the active array, the peripheral region including second elements having a second manufacturing precision less than the first manufacturing precision, wherein the second elements are isolated from the active array and comprise passive devices for improving operations of the active array.

15 Claims, 6 Drawing Sheets

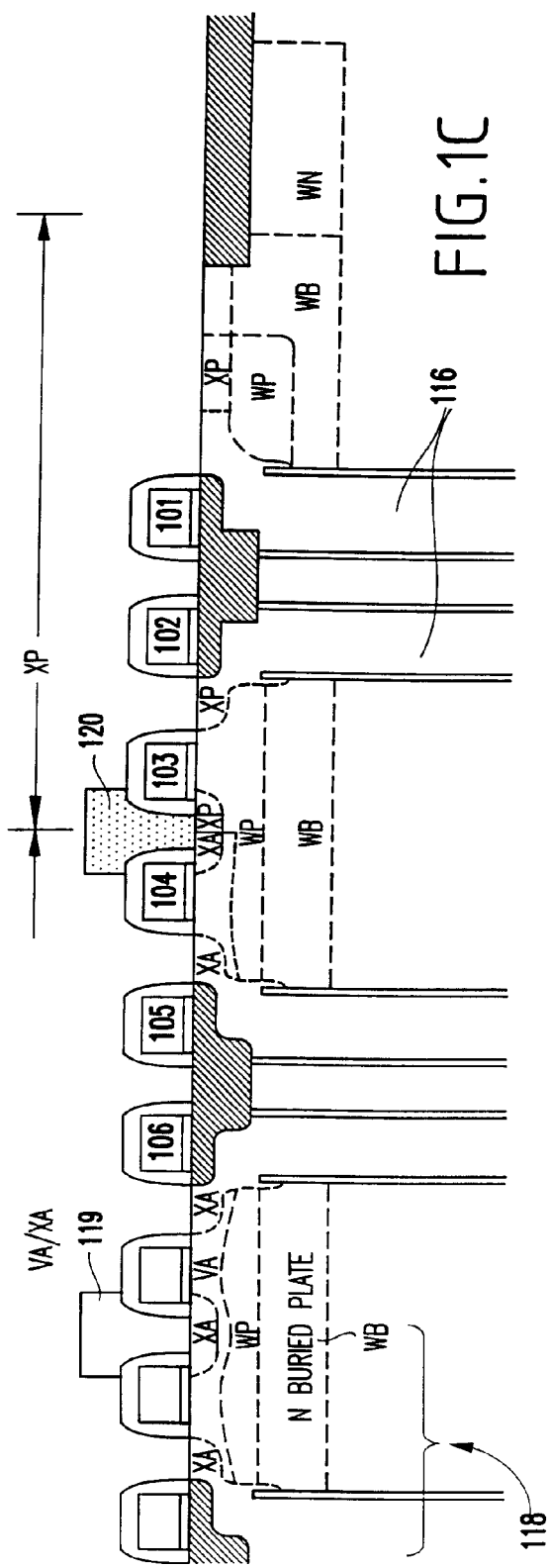
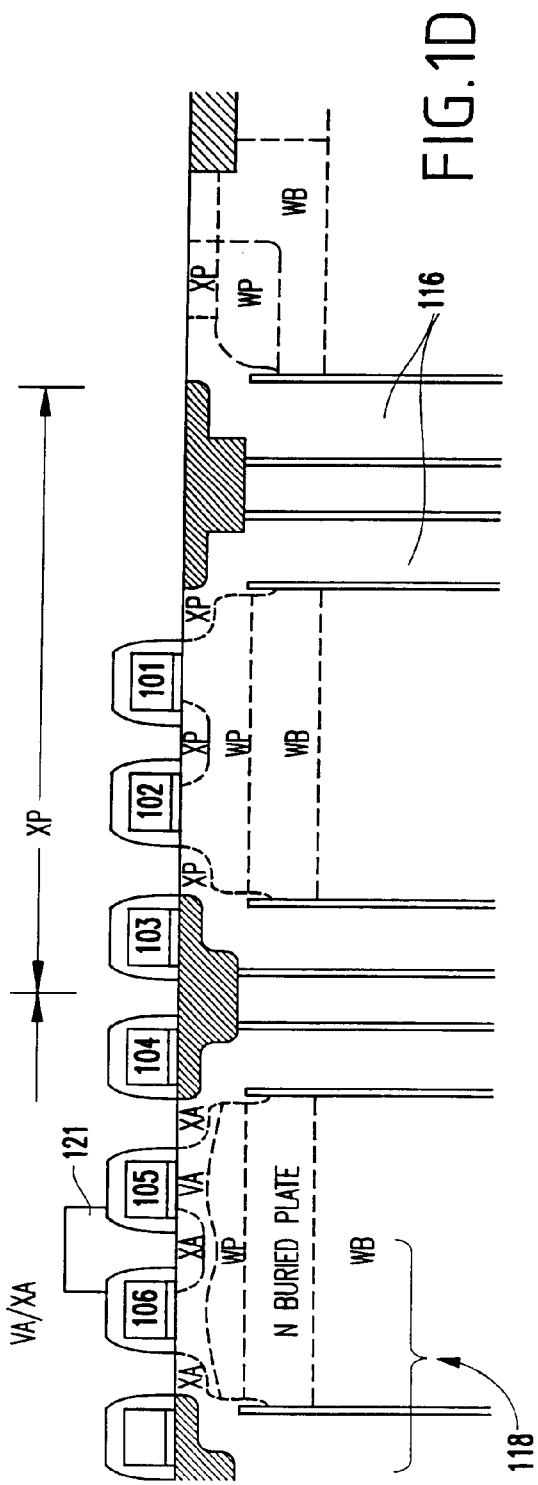

METAL OXIDE SEMICONDUCTOR CAPACITOR UTILIZING DUMMY LITHOGRAPHIC PATTERNS

CROSS-REFERENCE TO RELATED APPLICATIONS

This application is a division of U.S. application Ser. No. 09/224,767 filed Jan. 4, 1999 now U.S. Pat. No. 6,157,067.

BACKGROUND OF THE INVENTION

1. Field of the Invention

The present invention generally relates to the formation of capacitors in dynamic random access memory (DRAM) arrays and more specifically to the utilization of unused "Dummy" border areas of the DRAM arrays as capacitors and other useful structures.

2. Description of the Related Art

Large capacitors are often needed in very large scale integration (VLSI) circuits. However, such capacitors require a large amount of chip area. As the density of circuits increase, it becomes more difficult to allocate sufficient area for such capacitors.

VLSI circuits, such as dynamic random access memory (DRAM) arrays have uniform repeatable shape patterns which are formed by lithographic techniques. However, due to different pattern densities, the patterns along the edges of the array are slightly different than the patterns not located along the edge (e.g., the "edge" effect). For example, elements such as via contacts that are located near the edge of the array often have patterns after exposure which are smaller than those located in the middle of the array due to uneven pattern density.

To overcome this problem a few columns of "dummy" patterns are formed at the edge of the array. Therefore, there are no active devices located at the edge of the array and all active devices will have uniformly-patterned shapes. The dummy patterns formed along the edge of the array are normally tied to a certain voltage level (e.g., GND/Vdd) and are not used. For large arrays the area wasted by the dummy patterns can be significant.

The invention utilizes the otherwise wasted areas to formed useful elements such as capacitors. Therefore the invention increases the effective utilization of the chip.

SUMMARY OF THE INVENTION

It is, therefore, an object of the present invention to provide a semiconductor structure (and method for manufacturing the same) comprising an active array of first elements having a first manufacturing precision, a peripheral region surrounding the active array, the peripheral region including second elements having a second manufacturing precision less than the first manufacturing precision, wherein the second elements are isolated from the active array and comprise passive devices for improving operations of the active array.

The active array comprises an active memory array including bitlines and active wordlines. The second devices comprise dummy wordlines, deep trench capacitors, dummy devices, etc. and the second manufacturing precision is insufficient to use the dummy wordlines as the active wordlines. More specifically, the second devices could be capacitors (decoupling capacitors or reservoir capacitors), resistors, diodes or inductors.

The invention could also include a voltage regulator connected to the array, wherein the second devices add capacitance to the voltage regulator. The voltage regulator could be a negative wordline voltage regulator or a boosted wordline voltage generator.

BRIEF DESCRIPTION OF THE DRAWINGS

The foregoing and other objects, aspects and advantages will be better understood from the following detailed description of preferred embodiments of the invention with reference to the drawings, in which:

FIGS. 1C–1D are schematic illustrations of cross-sectional views of the DRAM array illustrated in FIG. 1B drawn along lines x—x and y—y, respectively;

DETAILED DESCRIPTION OF REFERRED EMBODIMENTS OF THE INVENTION

As mentioned above, it is common to form dummy patterns around the edge of a semiconductor chip array to avoid problems associated with the non-uniform patterns which form along the edges of an array. Conventional structures leave the dummy patterns unused. The invention takes advantage of these unused portions of the chip by creating passive devices such as capacitors, resistors, diodes, inductors, etc. in the unused dummy patterns.

In the following discussion a large capacitor, such a decoupling capacitor, reservoir capacitor or other similar capacitor is used to illustrate features of the invention. However, the invention is not limited to a capacitor but it is equally applicable to any device which can be manufactured using the area occupied by the dummy patterns.

The usefulness of a reservoir capacitor, for example, is illustrated in the following discussion. In high density DRAM designs, a boosted wordline voltage is usually generated internally by a charge pump and then regulated by a voltage regulator. The reservoir capacitor keeps the boosted level voltage relatively stable. During DRAM operations, such as reading or writing to/from a cell, the wordlines are accessed with a boosted voltage (Vpp). This voltage is normally much higher than the internal supply voltage (Vint). For example, for 1 Gb DRAM technology Vpp=3.3V, and Vint=2.1V. The boosted voltage is needed to enhance DRAM access time. Therefore, when wordlines are accessed, a large amount of current is drawn from the Vpp supply. If the reservoir capacitor of Vpp is not large enough, a noise spike will be shown on the Vpp. The noise is not desirable and could result in a performance penalty or, worse, access failure.

Conventionally, the reservoir capacitor is formed with large metal oxide semiconductor (MOS) capacitors having MOS gates or active diffusion junctions. The reservoir capacitor requires a large surface area. If the dielectric quality is poor then the Vpp voltage stress on the node of the capacitor could result in capacitor dielectric breakdown. Each wordline has its own drivers and the Vpp supply line links to devices of the wordline drivers. However, the conventional approaches for forming a reservoir capacitor are disadvantageous because such conventional large MOS capacitors require a large surface area.

Figure 1A:
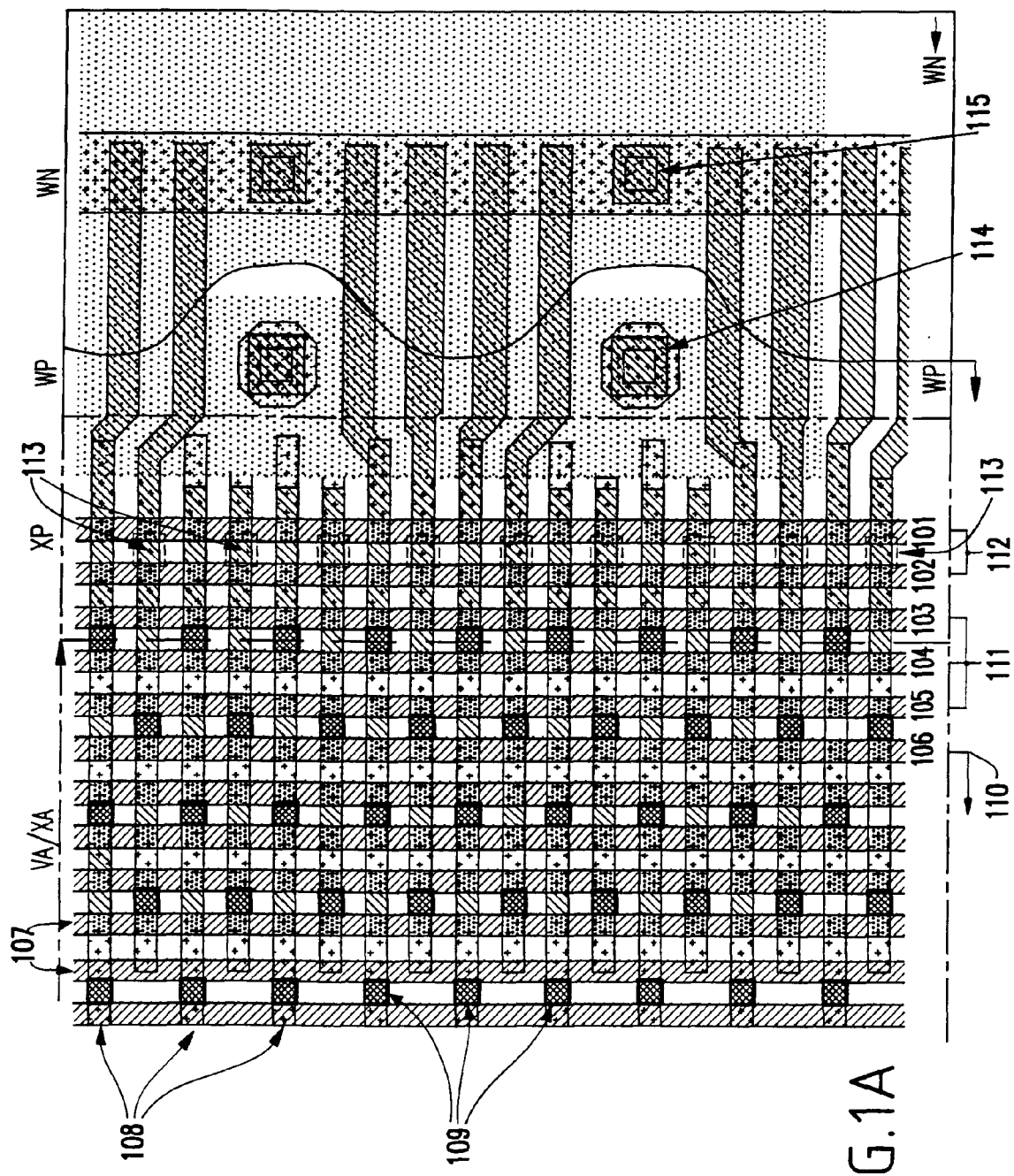
FIG. 1A is a schematic illustration of a top view of a DRAM array showing portions of an array and array edges.

Referring to FIG. 1A, a high density DRAM array is illustrated. The DRAM array includes bit lines 108 running horizontally, wordlines 107 running vertically, bit line contacts 109 (e.g., CB's). The outermost wordlines 101–105 represent the dummy patterns area of this array. The wordlines from wordline 106 toward the inside of the array (as indicated by arrow 110) are the active elements of the array.

Wordlines 103–105 which are grouped as item 111 are grounded, which effectively removes them from the active area of the array. The wordlines 101–102 are connected to a supply voltage. Wordlines 101, 102 act as capacitors and add to the capacitance value of the reservoir capacitor.

Contrary to conventional structures, the bitline contacts 113 are removed from (e.g., not formed on) the portions of bit lines 109 between the dummy wordlines 101, 102 to prevent electrical contact between wordlines 101, 102 and the active area of the array.

FIG. 1A also illustrates an array implant mask (XA– an n+ implant for NFET devices; and VA– an NFET threshold voltage adjustment implant for the array), a p-type implant for the capacitor, and p-well and n-well implant masks (WP and WN). The n-well implant (WN) is used to make contact with the buried n-diffusion plate (WP).

Conventionally, the array implant masks XA, VA would extend all the way to the edge of the array. However, with the invention the array implant masks XA, VA are not formed over the dummy wordlines 101–103 and instead a p+ implant for p-type diffusion (XP) is made over the dummy wordlines 101–103.

As shown in FIGS. 1C and 1D, the XP mask forms a P-type implant into the source/drain areas of the wordline 101 to 103. The P-type implant improves the sheet resistance of the p-well, which is connected to a negative voltage (e.g. –0.5 v). These extended p-diffusions areas enhance the capacitance and allow the wordlines 101, 102 to be used as gate capacitors.

Therefore, by modifying the connections to the outermost wordlines 101, 102, by removing the bitline contracts 113 and by modifying the implant to the dummy wordlines, the otherwise unused dummy wordlines can be utilized as capacitors.

The following modifications to the conventional process are straightforward in that no processing steps are added to the conventional manufacturing process and no additional chip area is used. Therefore, the additional capacitance comes at basically no additional cost. To the contrary, the performance increase is substantial, as illustrated in the graph in FIG. 2 at curve 300 and 400.

Figure 2A:
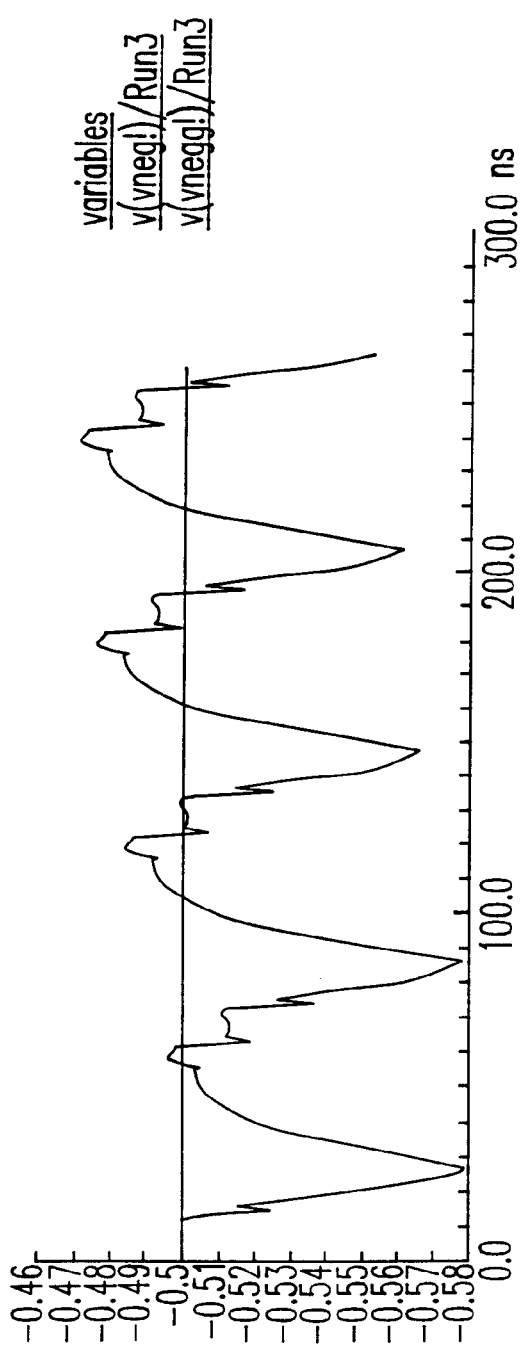
FIG. 2 is a graph illustrating voltage verses time for the negative wordline voltage of a DRAM with and without the invention.
Figure 2B:
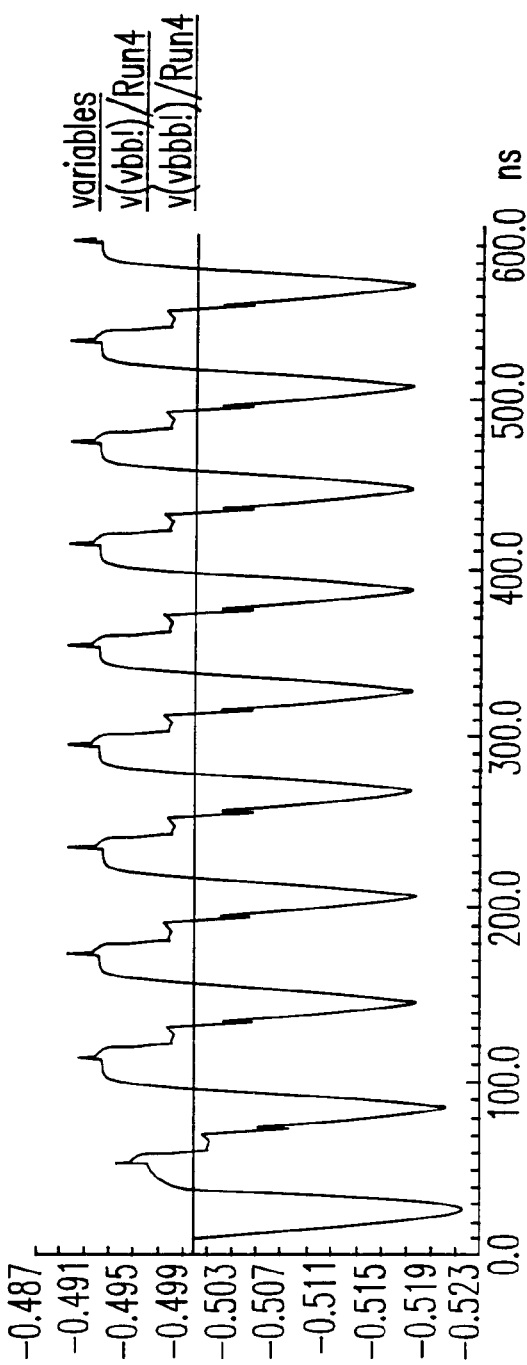

FIG. 2 illustrates a simulation of variations seen from the wordline low supply voltage 500 (e.g., –0.05V), which is sometimes referred to herein as negative wordline voltage (Vneg), with the present invention 400 and without the present invention 300. Curve 300 shows a variation from Vneg of about 100 millivolts, which is about 20% of the –0.5 V applied. To the contrary, with the invention, the simulation shown in curve 400 has variations of only about 28 millivolts from curve 500, which is approximately only 5% of the –0.5 supply voltage.

Therefore, at substantially no additional cost, tremendous benefits can be enjoyed with the invention. Such supply voltages which benefit enormously from the invention include boosted wordline high voltage and negative wordline low voltage. These voltages are generated by the chip and need to be maintained at a constant level inside the array for the best operation. Current engineering designs favor incorporating either a boosted wordline high voltage (e.g. 3.3 V) with a standard wordline low of 0 V or a standard wordline high (e.g., 2.8 V) with a negative wordline low of –0.5 V.

Other supply voltages which can benefit from the extra capacitance offered with the invention includes the bitline equalization voltage, which is typically 0.9 V, and the bitline high voltage, which is typically 1.8 V. These voltages are supplied to components in the sense amplifier part of memory ICs for precharging bitlines and establishing the high bitline voltage.

Figure 1B:
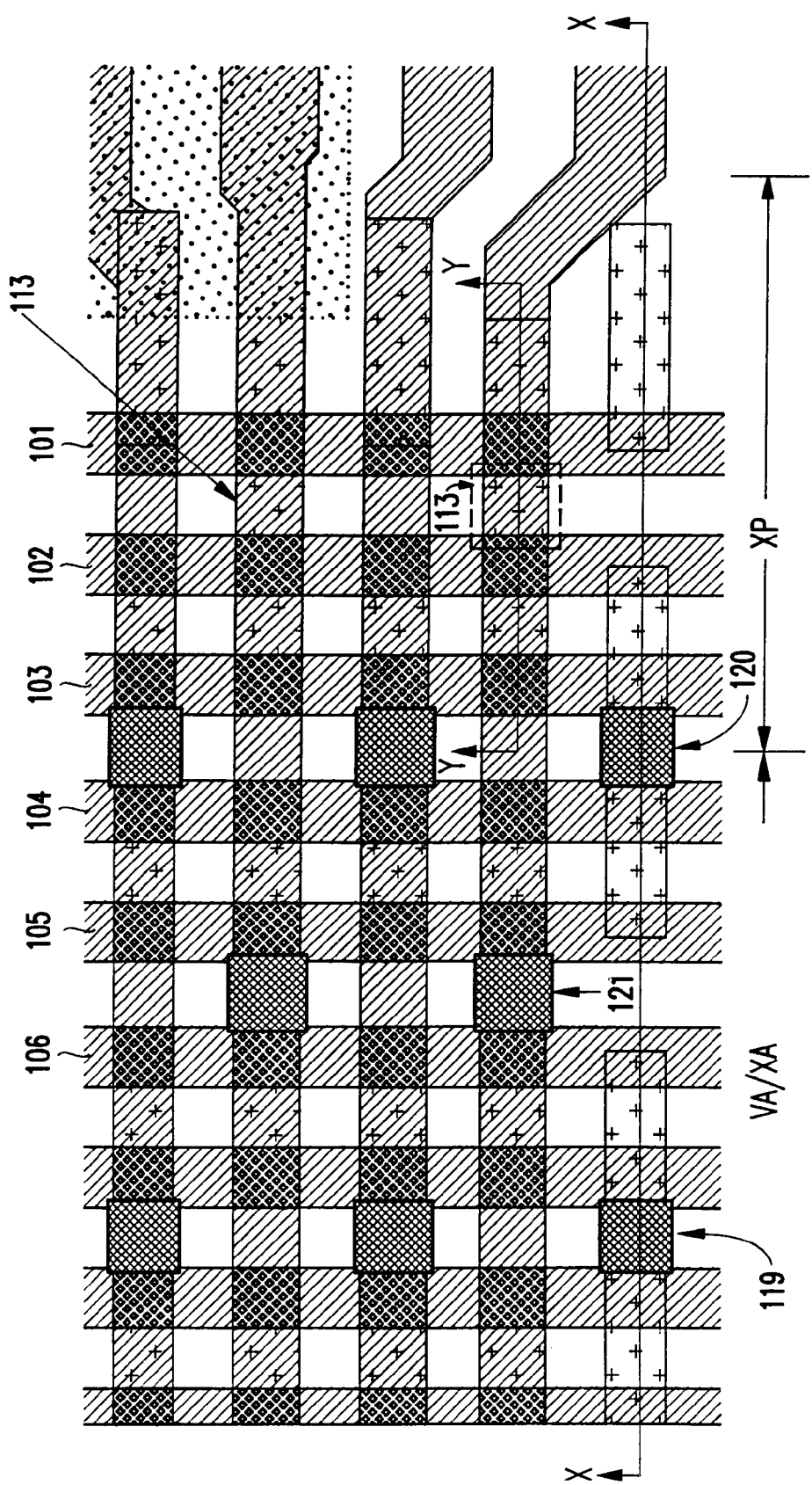
FIG. 1B is a schematic illustration of a top view of a portion of the DRAM array illustrated in FIG. 1A.

FIG. 1B is a portion of the array illustrated in FIG. 1A (segregated with a dashed line). However, FIG. 1B illustrates cross-sectional lines y—y and x—x which serve as reference lines for FIGS. 1C and 1D. For reference, bitline contacts 119–121 are identified in FIGS. 1B–1D.

FIG. 1C illustrates a cross-sectional view drawn along line x—x of FIG. 1B. In FIGS. 1C–1D, the wordlines 101–106, bitline contacts 119–121 and implantation regions VA/XA, XP are illustrated. In addition, the dummy deep trenches 116 below the wordlines 101, 102, which are not utilized, are illustrated. As would be known by one ordinarily skilled in the art given this disclosure, with some mask modifications it is possible to utilize the dummy deep trenches as part of the capacitor. FIGS. 1C and 1D also illustrate the various doped regions of the array including the n+ buried plate (WB), the p-well (WP), the array n+ region (XA) the array NFET threshold voltage adjustment implant (VA), the n-well (WN), and the p+ implant (XP).

As mentioned above, because of the different implants and different electrical connections, the wordlines 101, 102 act as gate capacitors to increase the capacitance of a large capacitor (such as the reservoir capacitor). FIGS. 1A–1D also illustrates the first active cell region 118 beginning with wordline 106.

Figure 3:
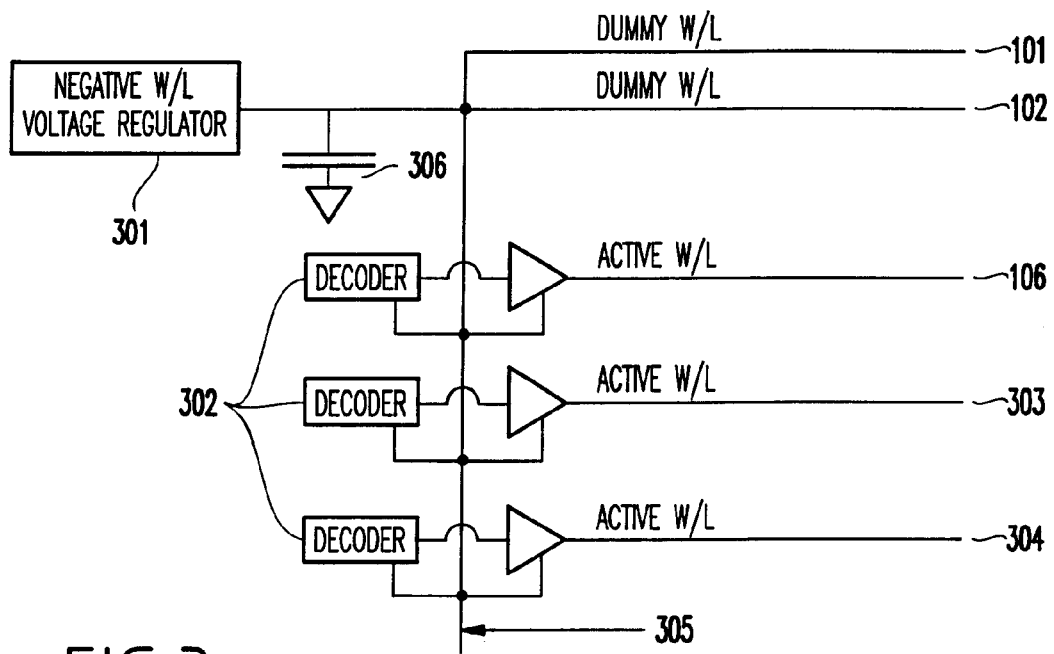
FIG. 3 is a schematic diagram of a circuit having a negative wordline voltage regulator according to the invention.

FIG. 3 is a schematic diagram illustrating the usefulness of the invention with a negative wordline voltage regulator. More specifically, FIG. 3 illustrates the negative wordline voltage regulator 301, decoders 302, the previously discussed dummy wordlines 101, 102, three active wordlines 106, 303, 304 and a wordline driver inputting a driver signal to the line shown at 305. As mentioned above, the dummy wordlines 101, 102 add capacitance to the capacitor 306 which maintains the wordline low voltage, such as the wordline low of –0.5 volts.

Figure 4:
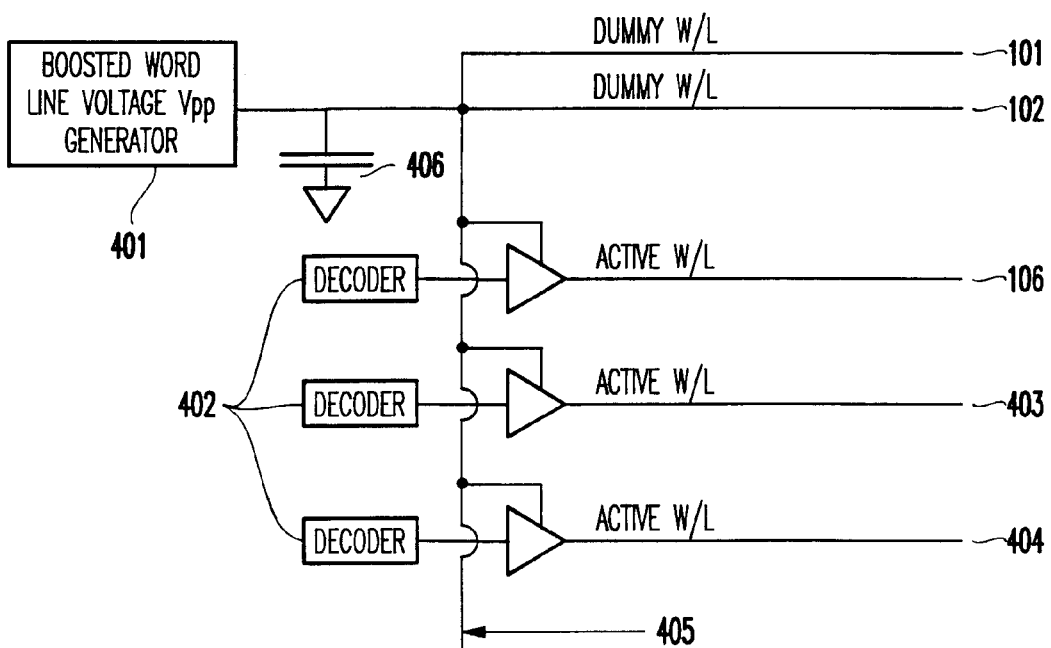
FIG. 4 is a schematic diagram of a circuit having a boosted wordline voltage generator according to the invention.

FIG. 4 is a schematic diagram illustrating the usefulness of the invention with a boosted wordline voltage generator. More specifically, FIG. 4 illustrates the boosted wordline voltage generator 401, decoders 402, the previously discussed dummy wordlines 101, 102, three active wordlines 106, 403, 404 and a wordline driver inputting a driver signal to the line shown at 405. Again, the dummy wordlines 101, 102 add capacitance to the capacitor 406 which maintains the wordline boosted voltage, such as the wordline Vpp of 3.3 volts. The Vpp supply line links to a large junction area 250–252 of the word-line driver devices. These junction areas 250–252 make up part of the reservoir capacitor as shown in FIG. 4.

As mentioned above, the invention includes an array implant mask (XA– an n+ implant for NFET devices; and VA– an NFET threshold voltage adjustment implant), a p-type implant for the capacitor, and p-well and n-well implant masks (WP and WN). Conventionally, the array implant masks XA, VA would extend all the way to the edge of the array. However, with the invention the array implant masks XA, VA are not formed over the dummy wordlines 101–103 and instead a p+ implant for p-type diffusion (XP) is made.

Figure 5:
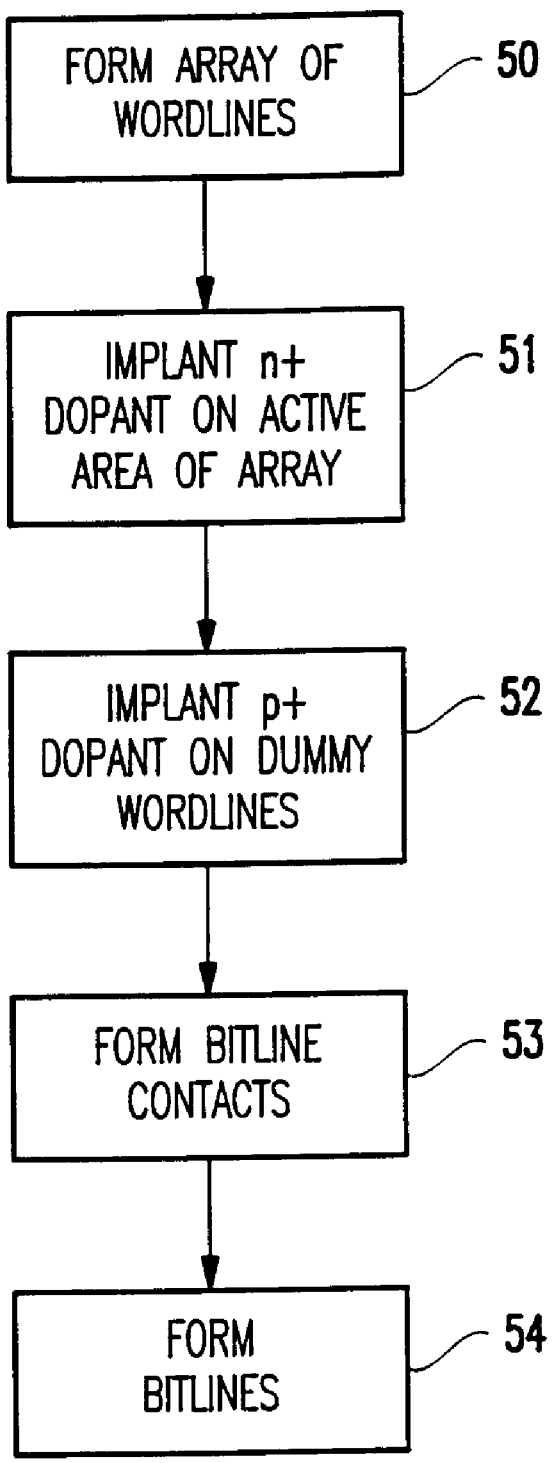
FIG. 5 is a flowchart illustrating a process of the invention.

FIG. 5 is a flowchart illustrating an embodiment of the invention which utilizes this unique doping scheme. More specifically, in block 50 the array of wordlines 107 is formed using conventional processes well known to those ordinarily skilled in the art. In block 51 the n+ doping is implanted on the active area of the array (e.g. wordlines 110). In block 52 they p+ doping is implanted on the dummy wordlines (e.g., wordlines 101–105). In block 53 the dummy wordlines 102, 101 are isolated from the active array by grounding wordlines 103–105. In block 54 the dummy wordlines 101, 102 are connected as additional capacitors to the charge pump 301, 401.

The foregoing invention is described with respect to a DRAM structure with deep trench capacitor cells, as distinguished from a DRAM structure with stacked capacitor cells. With stacked capacitors the typography of the array is very inconsistent. However, with deep trench capacitors the surface of the array is completely planarized. Therefore, with deep trench capacitors, the dummy wordlines make very good gate capacitors. However, with stacked capacitors, the dummy lithographic patterns would have to undergo substantial additional processing, including shaping and planarizing, in order to be used as gate conductors.

Therefore, as mentioned above, the invention is superior to conventional structures in that substantially no additional steps are required and no additional chip area is consumed in the creation of the additional capacitive elements. Further, the gate capacitors which are formed from the dummy wordlines have a very high quality and good integrity and can sustain at least the same boosted voltage as is applied to the active area wordlines. Also, the dummy wordlines are physically very close to the wordline drivers, which makes it easy to utilize the dummy wordlines as decoupling capacitors for the boosted wordline voltage supply or the negative wordline voltage supply. Also, the usage of the dummy wordlines as gate capacitors does not affect the performance of the active area of the array.

While the invention has been described in terms of preferred embodiments, those skilled in the art will recognize that the invention can be practiced with modification within the spirit and scope of the appended claims.

What is claimed is:

1. A process for manufacturing a semiconductor structure comprising:
   lithographically forming a repeating pattern of elements comprising an active array region surrounded by a peripheral region;
   defining, within said peripheral region, a first subset of said repeating pattern of elements and a second subset of said repeating pattern of elements, wherein said first subset is located between said active array region and said second subset;
   isolating said second subset from said active array region by connecting said first subset to ground; and
   forming at least one device comprising said second subset of said repeating pattern of elements.

2. The process of claim 1 further comprising implanting a p-type implant into said second subset.

3. The process of claim 1 wherein said active array region further comprises deep trench capacitors.

4. The process of claim 1 wherein said repeating pattern of elements comprises lines.

5. The process of claim 1 further comprising forming bitline contacts in said array region, but not in said peripheral region.

6. A process for manufacturing a semiconductor structure comprising:
   forming a plurality of wordlines in a memory array region;
   defining, within said memory array region, an active region surrounded by a peripheral region, said peripheral region including a subset of said plurality of wordlines, said subset comprising border wordlines and dummy wordlines, wherein said border wordlines are located between said active region and said dummy wordlines;
   isolating said dummy wordlines from said active region by connecting said border wordlines to ground; and
   connecting said dummy wordlines to a supply voltage.

7. The process of claim 6 further comprising implanting a p-type implant into said dummy wordlines.

8. The process of claim 6 wherein said active region further comprises deep trench capacitors.

9. The process of claim 6 wherein said plurality of wordlines comprises a lithographically defined pattern of lines.

10. The process of claim 6 further comprising forming bitline contacts in said array region, but not in said peripheral region.

11. A process for manufacturing a semiconductor structure comprising:
    lithographically forming a plurality of wordlines in a memory array region;
    defining, within said memory array region, an active region surrounded by a peripheral region, said peripheral region including a subset of said plurality of wordlines, said subset comprising border wordlines and dummy wordlines, wherein said border wordlines are located between said active region and said dummy wordlines; and
    isolating said dummy wordlines from said active region by connecting said border wordlines to ground.

12. The process of claim 11 wherein said active region further comprises deep trench capacitors.

13. The process of claim 11 further comprising forming bitline contacts in said array region, but not in said peripheral region.

14. The process of claim 11 further comprising implanting a p-type implant into said dummy wordlines.

15. The process of claim 11 further comprising connecting at least one of said dummy wordlines to at least one of a supply voltage, a capacitor, a resistor, a diode, an inductor, a voltage regulator or a charge pump.

* * * * *